United States Patent [19]

Miller

[11] Patent Number: 5,049,833

[45] Date of Patent: Sep. 17, 1991

[54] AMPLIFIER STAGE

[75] Inventor: Ira Miller, Tempe, Ariz.

[73] Assignee: Motorola, Inc., Schaumburg, Ill.

[21] Appl. No.: 546,978

[22] Filed: Jul. 2, 1990

[51] Int. Cl.$^5$ .............................................. H03F 3/45
[52] U.S. Cl. .................................... 330/253; 330/257
[58] Field of Search ................ 330/253, 257, 258, 300

[56] References Cited

U.S. PATENT DOCUMENTS 4,667,164  5/1987  Doluca ................................ 330/253

*Primary Examiner*—James B. Mullins
*Attorney, Agent, or Firm*—Michael D. Bingham

[57] ABSTRACT

An integrated amplifier that can be use as a standard cell which includes a differential input stage and an output stage to provide an increased input common mode range. The differential input stage includes a pair of differentially configured PMOS transistors coupled to a differential-to-single ended converter comprised of a pair of NMOS transistor. A PNP transistor is formed in the integrated circuit having its base-emitter junction coupled between the drain and gate of one of the NMOS transistors to thereby establish therewith a voltage at the drain of the PMOS device coupled to the inverting input of the amplifier sufficient to maintain the latter in its linear operating range as the input thereto is common moded to ground.

5 Claims, 1 Drawing Sheet

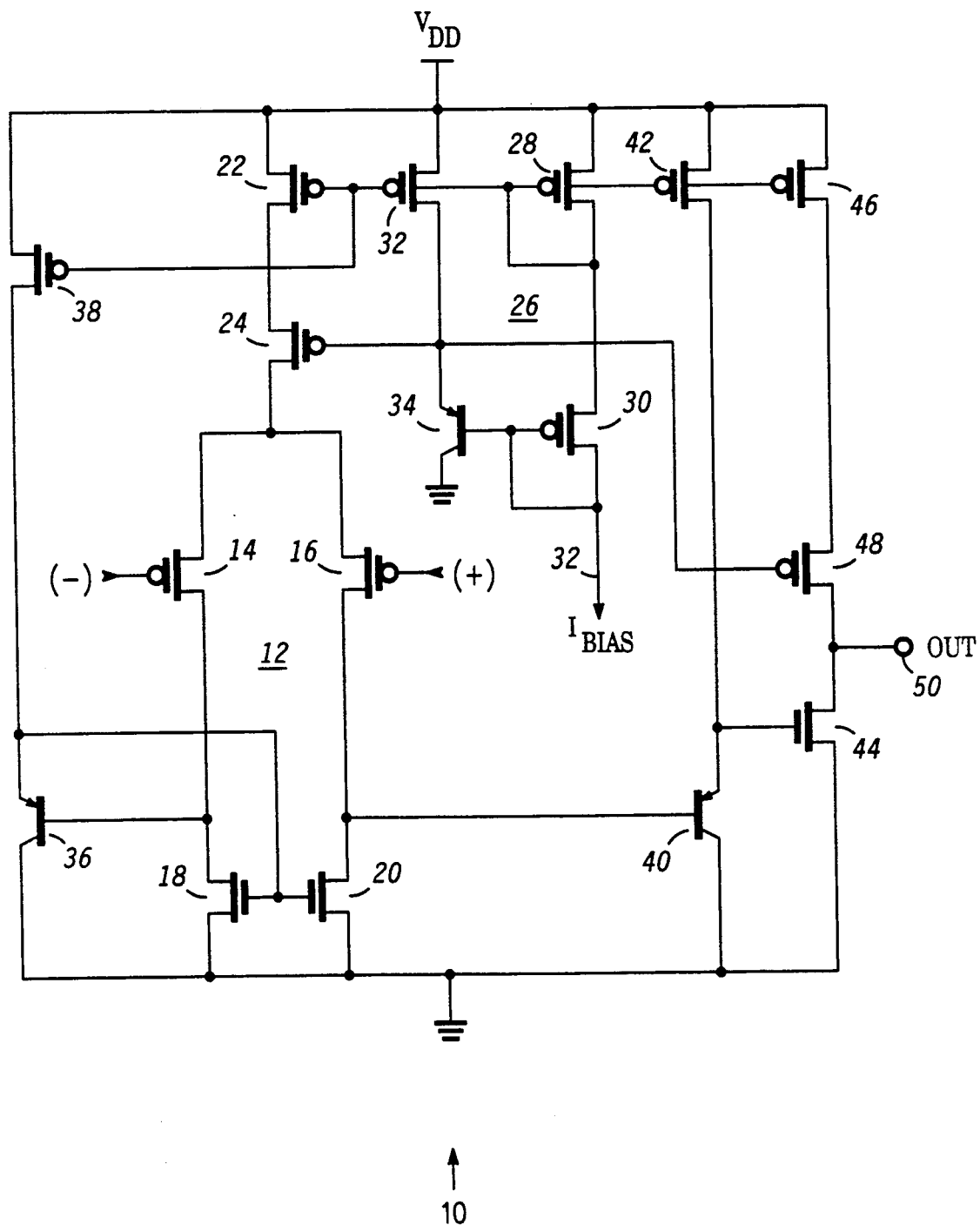

AMPLIFIER STAGE

BACKGROUND OF THE INVENTION

The present invention relates to amplifier circuits and, more particularly, to a bipolar-CMOS differential amplifier stage that can common mode to ground and which may be utilized as a standard amplifier cell in designing and manufacturing integrated circuits.

Differential amplifiers that can common mode to substantially ground utilizing a single power supply are well known in the art. For example, U.S. Pat. No. 3,649,846 discloses such an amplifier which may also be used as a comparator for comparing input voltages having a common mode voltage range extending to zero volts. Many standard operational amplifiers, which are manufactured by Semiconductor manufacturers, use the teaching of the aforementioned patent. Although the foregoing referenced amplifier works quite well it does suffer from some drawbacks which are addressed by the present invention.

Amplifiers made in accordance with the teaching of the cited patent are constructed using bipolar transistors and bipolar techniques and require the use of the PNP transistor followers to the input of the differential amplifier stage. This limits the closeness that the input differential stage can operate to the positive supply rail as well as the circuit offset voltage. In addition, the bipolar process requires greater die area to be utilized to manufacture the amplifier in integrated circuit form than required by other processes, i.e., CMOS or BiCMOS. Further, it is desirable to lower device count.

Hence, a need exists for an improved amplifier stage that can be used as a standard cell for designing and manufacturing integrated circuits and which will common mode to ground without the need of input follower devices as well as operate near the positive supply rail.

SUMMARY OF THE INVENTION

Accordingly, it is an object of the present invention to provide an improved amplifier stage incorporating both bipolar and CMOS transistors.

Still another object of the present invention is to provide an integrated operational amplifier that operates from a single power supply and which in the linear mode the input common-mode voltage includes ground.

In accordance with the above and other objects there is provided an amplifier comprising a first pair of MOS transistors of a first conductivity type the gates of which are coupled to respective inputs of the amplifier; a second pair of MOS transistors of a second conductivity type the drains of which are coupled respectively to the drains of the first pair of transistors, and whose gates are interconnected; and a first bipolar transistor having a base and emitter coupled respectively to the drain and gate of the first one of said second pair of transistors and a collector connected to the sources of said second pair of transistors.

BRIEF DESCRIPTION OF THE DRAWING

The single figure is a schematic diagram illustrating the present invention.

DETAILED DESCRIPTION OF THE PREFERRED EMBODIMENT

Turning to the FIGURE there is shown amplifier 10 of the present invention which is suited to be manufactured in integrated circuit form using conventional CMOS processes. Amplifier 10 is comprised of differential input stage 12 including PMOS transistors 14 and 16 the gates of which are directly coupled to the differential inputs of the amplifier and whose drains are connected to a differential to single ended converter formed of NMOS transistors 18 and 20 along with the parasitic form PNP transistor 36. The drains of transistors 18 and 20 are connected to the drains of transistors 14 and 16 respectively while their gates are interconnected. The sources of transistors 18 and 20 are connected to a power supply conductor to which ground is supplied. A current supply 26 provides a reference current to the interconnected sources of transistors 14 and 16. A pair of cascoded PMOS transistors 22 and 24 coupled between the positive supply rail to which is supplied Vdd and the interconnected sources of transistors 14 and 16 provide the actual current to differential input stage 12. The cascoded transistors 22 and 24 are used since a higher impedance is presented to transistors 14 and 16. However, this configuration causes a higher voltage drop from Vdd to the drain of transistor 24. This can otherwise limit how close differential input stage 12 can operate to Vdd. However, the remainder of current supply 26 reduces the voltage drop to approximately 0.5 volts as will be discussed in order to permit amplifier 10 to operate closer to Vdd. As illustrated, a pair of diode configured PMOS transistors 28 and 30 are series connected between Vdd and terminal 32 from which a reference current $I_{Bias}$ is sank. Transistors 28 and 30 are operated as diodes by having their respective gate and drain shorted together. A current source PMOS transistor 32 has its source-drain conduction path coupled to the emitter of PNP transistor 34 while its gate is interconnected to both of the gates of transistors 22 and 28. The base of transistor 34 is coupled with the gate of transistor 30 while its collector is returned to ground. A current source PMOS transistor 38 having its source-drain conduction path coupled to the emitter of transistor 36 and its gate coupled to the gate of transistor 22 provides the operating current to transistor 36. Amplifier 10 includes an output stage comprising PNP parasitic transistor 40 which is configured as an emitter follower in the same manner as transistor 36 by having its base coupled to drain of transistor 20, its collector coupled to the ground supply rail while the emitter is coupled both to the drain of PMOS transistor 42 and the gate of NMOS transistor 44. The gate of transistor 42 is coupled to the gate of transistor 28 while it source is returned to Vdd. The output stage further includes PMOS transistor 46 and PMOS transistor 48 which are cascoded between the positive supply rail and output 50 of amplifier 10 with their respective gates being coupled to the gate of transistor 28 and the gate of transistor 24. The drain of transistor 48 is coupled to the drain of transistor 44 the latter of which has its source coupled to the negative or ground supply rail.

Amplifier 10 operates in a conventional manner in that a differential input signal applied across the non-inverting (+) and inverting (−) inputs of differential input stage 12 is converted to a single-ended output which is applied and amplified by the output stage to appear at output 50. Amplifier 10's unique CMOS input stage including PNP transistor 36 permits the input signal to common mode to ground without requiring transistor followers coupled between transistors 14 and 16 and the respective non-inverting and inverting inputs as required by conventional differential amplifiers. For example, if the inputs of differential stage 12 are at ground, the drain of transistor 14 is at a potential of:

$$Vdrain = Vgs18 - Vbe36$$

where
Vgs18 is the source to gate potential of transistor 16; and Vbe36 is the base to emitter voltage of transistor 36. Hence, the drain is approximately at 0.5 volts while its source is nominally at a potential of 1.2 volts (assuming typical values of Vgs of 1.2 volts and Vbe of 0.7 volts) with respect to ground. Thus, a voltage drop of approximately 0.7 volts appears across the source to drain of transistor 14 which is sufficient to maintain the transistor in its saturation operating range. It is understood from the foregoing and by proper ratioing of the channel width to length that transistors 16, 18 and 20 can therefore also be maintained in their saturation operating range with the inputs of amplifier 10 common moded to ground.

Cascoded transistors 22 and 24 are utilized to supply the operating current Io to input stage 12 as they exhibit an increase output impedance. However, this configuration would require a larger voltage drop from the positive supply rail to the drain of transistor 24. To reduce this voltage drop, PNP transistor 34 is utilized in conjunction with the remaining transistors of current supply 26. Thus, the voltage potential appearing at the drain of transistor 22 with respect to Vdd can be derived as follows:

$$Vdrain = Vgs28 + Vgs30 - Vbe34 - Vgs24$$

where
Vgs is the gate to source voltage drop for the respective transistors 28, 30 and 24 while Vbe is the base to emitter voltage drop between the base-emitter of transistor 34.

Hence, the voltage at the drain of transistor 22 is approximately equal to 0.5 volts below Vdd. Again, by being particular in the ration of the width to length of the channels, the voltage drop across the source-drain of transistors 22 and 24 can be nearly the same. This same condition exists with respect to the output stage comprising transistors 46 and 48. Thus, amplifier 10 can effectively operated between ground to within a few tenths of a volt of Vdd.

It is understood that amplifier 10 can perform the function of comparing an input signal to ground reference utilizing a single power supply. In this application, for example, the non-inverting input would be biased at a predetermined potential while the input signal to be compared thereto is applied to the inverting input.

Hence, what has been described above is a novel amplifier cell that can be fabricated using standard CMOS processes which has an increased input common mode range which comprises a differential input stage that does not require the use of quasi-Darlington input transistors.

What is claimed is:

1. An integrated differential amplifier having first and second inputs and an output, comprising:
   first and second power supply conductors;
   first and second MOS field effect transistors of a first conductivity type each having a gate, a drain and a source, said gates being coupled respectively to the first and second inputs, and said sources being interconnected;
   current supply means coupled between said first power supply conductor and said interconnected sources of said first and second transistors for supplying a reference current thereto;
   third and fourth MOS transistors of a second conductivity type, each having a gate, a drain and a source, said gates being interconnected, said sources being coupled to said second power supply conductor and said drains being coupled respectively to said drains of said first and second transistors;
   means for coupling said drain of said fourth MOS transistor to the output of the amplifier; and
   first transistor means of opposite conductivity than said third and fourth MOS transistors and having a base and emitter coupled between said drain and gate of said third MOS transistor, said emitter coupled to said current supply means for receiving operating current therefrom.

2. The amplifier of claim 1 wherein said means for coupling said drain of said fourth MOS transistor to the output of the amplifier includes second transistor means having a base coupled to said drain of said fourth MOS transistor, a collector coupled to said second power supply conductor and an emitter; and an additional current supply means for providing current to said second transistor means.

3. An integrated differential amplifier having first and second inputs and an output, comprising:
   first and second power supply conductors;
   first and second MOS field effect transistors of a first conductivity type each having a gate, a drain and a source, said gates being coupled respectively to the first and second inputs, and said sources being interconnected;
   current supply means coupled between said first power supply conductor and said interconnected sources of said first and second transistors for supplying a reference current thereto;
   third and fourth MOS transistors of a second conductivity type, each having a gate, a drain and a source, said gates being interconnected, said sources being coupled to said second power supply conductor and said drains being coupled respectively to said drains of said first and second transistors;
   means for coupling said drain of said fourth MOS transistor to the output of the amplifier including second transistor means having a base coupled to said drain of said fourth MOS transistor, a collector coupled to said second power supply conductor and an emitter; and an additional current supply means for providing current to said second transistor means;
   first transistor means having a base and emitter coupled between said drain and gate of said third MOS transistor and a collector coupled to said second power supply conductor;
   fifth and sixth MOS transistors of said first conductivity type cascoded between said first power supply conductor and said interconnected sources of said first and second MOS transistors;
   third transistor means having a base, an emitter and a collector, said emitter being coupled to the gate of said sixth MOS transistor and said collector being coupled to said second power supply conductor;
   seventh MOS transistor of said first conductivity type having a source coupled to said first power supply conductor, a drain coupled to said emitter of said third transistor means and a gate coupled to the gate of said fifth MOS transistor;

an eighth MOS transistor of said first conductivity type having a source coupled to said first power supply conductor, and a drain and gate interconnected to said gate of said fifth transistor;

a ninth MOS transistor of said first conductivity type having a source coupled to said drain of said eighth transistor, a drain and a gate interconnected to said base of said third transistor means; and means coupled to said drain of said ninth transistor for sinking a reference current.

4. The amplifier of claim 3 wherein said means for coupling said drain of said fourth MOS transistor to the output includes:

a tenth MOS transistor of said second conductivity type having a gate coupled to said emitter of said second transistor means, a source coupled to said second power supply conductor and a drain coupled to the output of the amplifier; and an active load means coupled between said first power supply conductor and said drain of said tenth MOS transistor.

5. The amplifier of claim 4 including:

said active load means includes eleventh and twelfth MOS transistors of said first conductivity type cascoded between said first power supply conductor and the output of the amplifier, said transistors further having a gate with said gate of said eleventh transistor being coupled to said gate of said eigth transistor and said gate of said twelfth transistor being coupled to said emitter of said third transistor means; and means for supplying bias current to said emitter of said first transistor means.

* * * * *